US008723123B2

(12) United States Patent
Kalnitsky et al.

(10) Patent No.: US 8,723,123 B2
(45) Date of Patent: May 13, 2014

(54) LIGHT DETECTOR WITH GE FILM

(75) Inventors: Alexander Kalnitsky, San Francisco, CA (US); Chia-Hua Chu, Zhubei (TW); Fei-Lung Lai, New Taipei (TW); Chun-Wen Cheng, Zhubei (TW); Chun-Ren Cheng, Hsin-Chu (TW); Yi-Hsien Chang, Shetou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/595,743

(22) Filed: Aug. 27, 2012

(65) Prior Publication Data
US 2014/0054461 A1  Feb. 27, 2014

(51) Int. Cl.
*G01J 5/20* (2006.01)

(52) U.S. Cl.
USPC ........................................ 250/338.4

(58) Field of Classification Search
USPC ............................................ 250/338.1–338.5
See application file for complete search history.

(56) References Cited

U.S. PATENT DOCUMENTS

| 5,032,472 | A | * | 7/1991 | Michel et al. ................. 428/704 |
| 7,078,137 | B2 | | 7/2006 | Machiguchi et al. |
| 7,960,807 | B2 | | 6/2011 | Lin et al. |
| 2004/0248019 | A1 | * | 12/2004 | Machiguchi et al. ............. 430/7 |
| 2011/0235017 | A1 | * | 9/2011 | Iwasaki ......................... 356/4.01 |
| 2012/0061567 | A1 | * | 3/2012 | Rafferty et al. ................ 250/332 |

* cited by examiner

*Primary Examiner* — Kiho Kim
(74) *Attorney, Agent, or Firm* — Slater and Matsil, L.L.P.

(57) ABSTRACT

A light detector includes a first light sensor and a second light sensor to detect incident light. A Ge film is disposed over the first light sensor to pass infra-red (IR) wavelength light and to block visible wavelength light. The Ge film does not cover the second light sensor.

19 Claims, 4 Drawing Sheets

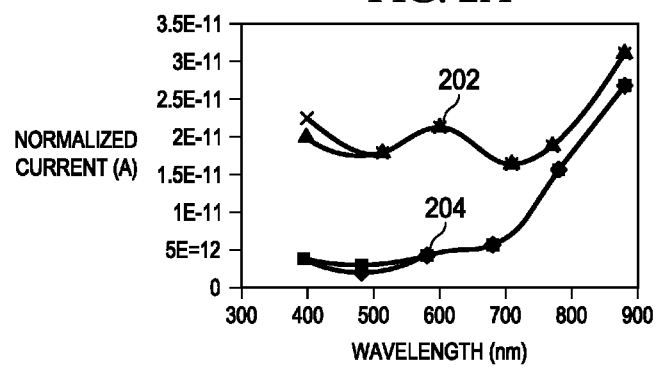
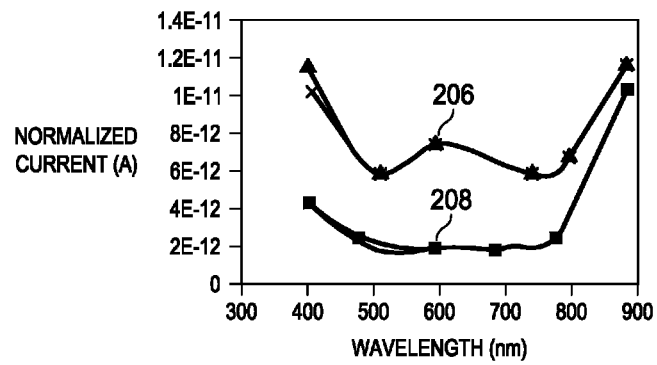
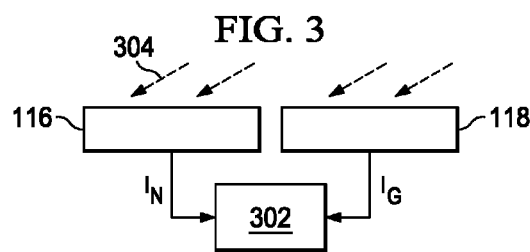

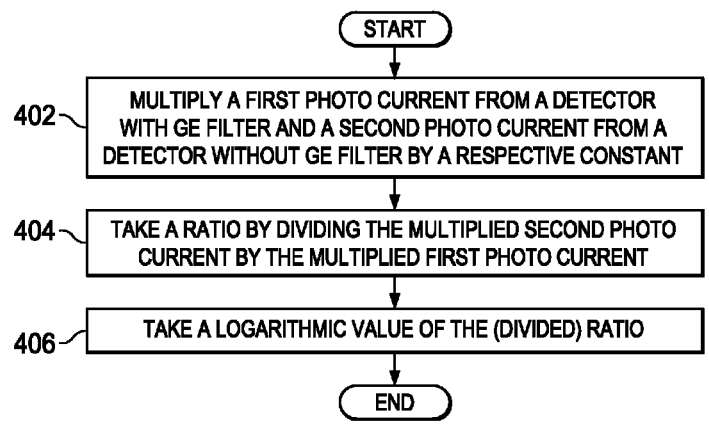
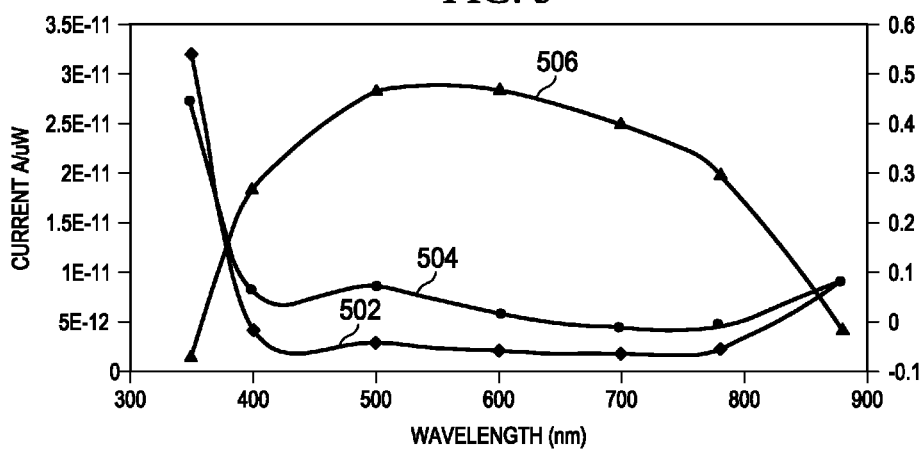

LIGHT DETECTOR WITH GE FILM

TECHNICAL FIELD

The present disclosure relates generally to an integrated circuit and more particularly to a light detector.

BACKGROUND

Some ambient light detectors are used to reduce overall display-system power consumption, e.g., for energy saving displays, by detecting ambient light conditions as a means of controlling display and/or keypad backlighting.

In order to achieve better ambient light sensing, it is desirable for the ambient light detectors to have a spectral response close to a human eye response. Because the human eye does not detect Infrared (IR) light starting at about 750 nm, good noise suppression from the non-visible light, such as (IR), is desirable.

BRIEF DESCRIPTION OF THE DRAWINGS

Reference is now made to the following descriptions taken in conjunction with the accompanying drawings, in which:

FIGS. 2A-2B are plots of spectral responses of exemplary light sensors in the light detector in FIG. 1C according to some embodiments;

FIG. 3 is a high level block diagram including a circuit block connected to sensor modules in FIG. 1C and/or FIG. 1D to produce a visible light response according to some embodiments;

FIG. 4 is a flowchart of a method for the circuit block in FIG. 3 to produce the visible light response according to some embodiments; and FIG. 5 is a plot of exemplary spectral responses from the circuit block and sensor modules in FIG. 3 according to some embodiments.

DETAILED DESCRIPTION

Figure 1A:
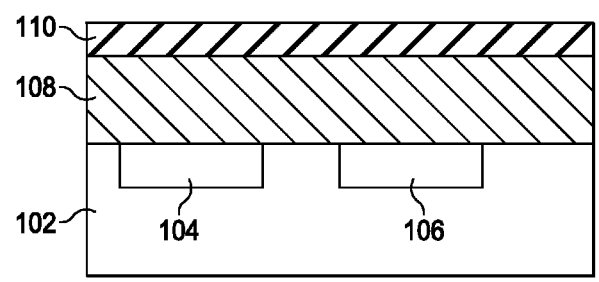
FIGS. 1A-1D are intermediate steps of fabricating an exemplary light detector according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1D are intermediate steps of fabricating an exemplary light detector 100 or 101 according to some embodiments. In FIG. 1A, two light sensors 104 and 106 that are formed on a substrate 102 (e.g., silicon) are shown. The light sensors 104 and 106 are photodiodes having a p-n junction or PIN structure in some embodiments. The light sensors 104 and 106 can be formed using any suitable process known in the art, e.g., doping P-type and/or N-type dopants on the substrate 102. Also, other electrical devices and components, such as transistors, resistors, capacitors, or any other devices, can be formed over the substrate 102 in some embodiments.

A dielectric layer 108 such as oxide is formed over the substrate 102 and the light sensors 104 and 106. Metal layers (not shown), e.g., aluminum, copper, or any suitable material, can be also formed over the substrate 102 and the light sensors 104 and 106 for electrical connections in some embodiments. A passivation layer 110, such as silicon nitride, is formed over the dielectric layer 110.

Figure 1B:
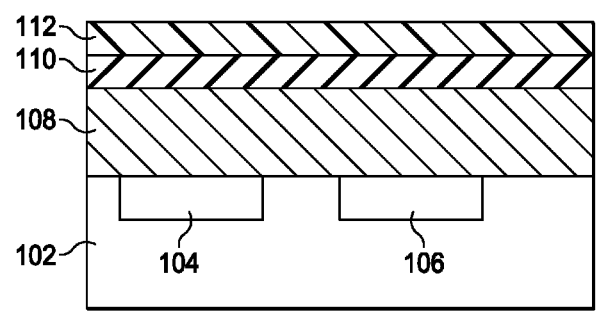

In FIG. 1B, a Ge film 112 is formed over the passivation layer 110 by sputtering, for example. The thickness ranges from 500 angstrom to 5000 angstrom depending on the desired light transmittance properties in some embodiments.

Figure 1C:
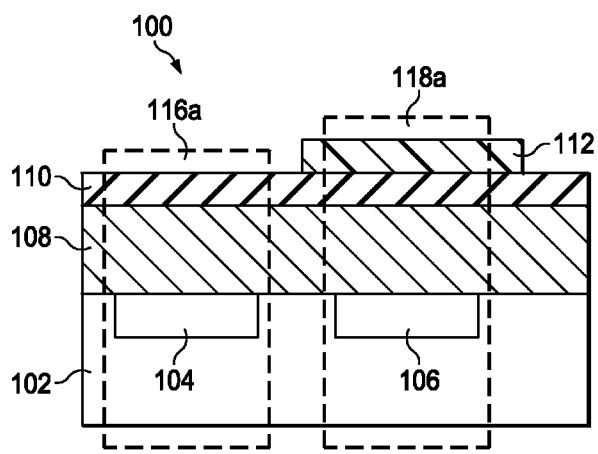

In FIG. 1C, the Ge film 112 is patterned (i.e., partially removed) by photolithography so that the Ge film 112 covers one light sensor 106 for a sensor module 118a and does not cover another light sensor 104 for a sensor module 116a of a light detector 100. The Ge film 112 functions as an infrared (IR) light pass filter or visible light stop filter, passing IR light and filtering out (i.e., absorbing or blocking) visible light. (Visible light has a wavelength in the range from about 380 nm to about 740 nm.)

Light transmittance of the Ge film 112 depends on the thickness. The thicker the Ge film 112 is, the lower is the light transmittance. The thickness ranges from 500 angstrom to 5000 angstrom depending on the desired light transmittance properties in some embodiments. The light sensor 106 (e.g., a photodiode) covered by the Ge film 112 can be used as an IR sensor in some applications. The light sensor 104 is not covered by the Ge film 112, and thus detects both visible and IR light.

The photocurrents from the sensor module 116a and from the sensor module 118a can be used to extract or produce a visible light response as described below in FIGS. 3-5. The process of forming the Ge film 112 (depositing and patterning, for example) are relatively simple with a minimum number of steps when compared to some other process having multiple color filters deposited and patterned over the substrate 102.

Figure 1D:
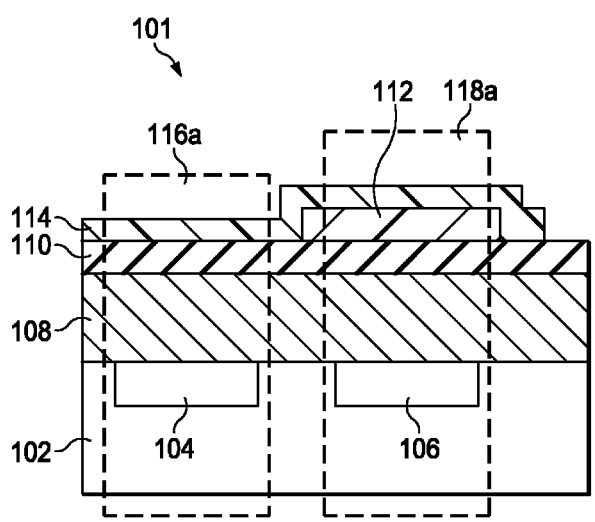

In FIG. 1D, an optional green filter layer 114 is formed over the passivation layer 110 and the Ge film 112 for a light detector 101. The green filter layer 114 covers both light sensors 104 and 106 for sensor modules 116b and 118b, respectively. The green filter layer 114 has a thickness ranging from 0.5 μm to 1 μm in some embodiments and the thickness can be determined based on the desired light transmittance and spectral response value. The photocurrents from the sensor module 116b and from the sensor module 118b can be used to extract or produce a visible light response as described below in FIGS. 3-5.

The green filter layer 114 comprises a copper phthalocyanine dye having its absorption maximum at a wavelength of 600 to 700 nm, and a pyridone azo dye having its absorption maximum at a wavelength of 400 to 500 nm in some embodiments. The green filter layer 114 has a transmittance of 5% or less at a wavelength of 450 nm and 62% or more at 535 nm in one example. The green filter layer 114 can be formed by organic spin and helps to obtain a spectral response closer to that of a human eye by maximizing the spectral response of the light detector 101 in the human-eye sensitive wavelength region (i.e., visible light).

Further process can be performed on the light detectors 100 in FIG. 1C and/or 101 in FIG. 1D, e.g., pad opening/formation for electrical contact, etc. in some embodiments. The light detectors 100 in FIG. 1C and/or 101 in FIG. 1D can save energy in some applications by adjusting the backlight source of electronic device displays for different usages based on the detected incident (ambient) light.

FIGS. 2A-2B are plots of spectral responses of exemplary light sensors in the light detector 100 in FIG. 1C according to some embodiments. In FIG. 2A, a curve 202 shows the spectral response of a light sensor with no Ge film such as in the sensor module 116a in FIG. 1C and a curve 204 shows the spectral response of a light sensor with Ge film such as in the sensor module 118a in FIG. 1C when the thickness of the Ge film is 1000 angstrom.

In FIG. 2B, a curve 206 shows the spectral response of a light sensor with no Ge film such as in the sensor module 116a in FIG. 1C and a curve 208 shows the spectral response of a light sensor with Ge film such as in the sensor module 118a in FIG. 1C when the thickness of the Ge film is 2500 angstrom. Comparing the curves 202 and 204 of FIG. 2A and the curves 206 and 208 of FIG. 2B, the thickness the Ge film such as 112 in FIG. 1C influences the spectral response values and shapes. For example, with a thicker Ge film, the spectral response values in FIG. 2B are lower than the spectral response values in FIG. 2A and the spectral response shape of the curve 208 in the visible light region of 500 nm to 740 nm is more flat compared to the curve 204 for the light sensor with Ge film.

FIG. 3 is a high level block diagram including a circuit block 302 connected to sensor modules 116 (116a/116b) and 118 (118a/118b) in FIG. 1C and/or FIG. 1D to produce a visible light response according to some embodiments. When there is incident light 304, the circuit block 302 receives a photocurrent $I_G$ from the light sensor 106 in the sensor module 118 (with Ge film) and a photocurrent $I_N$ from the light sensor 104 in the sensor module 116 (without Ge film) to extract/produce a visible light response based on the photocurrents. The function of the circuit block 302 is further described below.

FIG. 4 is a flowchart of a method for the circuit block in FIG. 3 to produce the visible light response according to some embodiments. At step 402, the photocurrents $I_G$ and $I_N$ are multiplied by a respective constant. For example, a constant A is multiplied to $I_N$ and a constant B is multiplied to $I_G$. (Constants A and B can be 1 that does not need a separate multiplication step in some embodiments.) At step 404, a ratio is taken by dividing the multiplied photo current $A \cdot I_N$ by the multiplied photo current $B \cdot I_G$. At step 406, take a logarithmic value (log) of the ratio of $A \cdot I_N / B \cdot I_G$ to produce the visible light response, resulting in the following value:

$$\mathrm{LOG}((A \cdot I_N)/(B \cdot I_G)) = \mathrm{LOG}(A) - \mathrm{LOG}(B) + \mathrm{LOG}(I_N) - \mathrm{LOG}(I_G) \quad (\mathrm{Eq.\ 1})$$

The resulting exemplary visible light response is shown in FIG. 5. The objective of this method is to produce a visible light response similar to the human eye response in some embodiments.

FIG. 5 is a plot of exemplary spectral responses from the circuit block 302 and sensor modules 116 and 118 in FIG. 3 according to some embodiments. A curve 502 shows a spectral response (photo current) from the light sensor 106 in the sensor module 118 with Ge film and a curve 504 shows a spectral response (photo current) from the light sensor 104 in the sensor module 116 without Ge film. A curve 506 is the visible light response resulting from taking a logarithmic value of the ratio of the two spectral responses 502 and 504. The exemplary curve 506 shows the extracted visible light response.

According to some embodiments, a light detector includes a first light sensor and a second light sensor to detect incident light. A Ge film is disposed over the first light sensor to pass infra-red (IR) wavelength light and to block visible wavelength light. The Ge film does not cover the second light sensor.

According to some embodiments, a method of fabricating a light detector includes forming a first light sensor and a second light sensor on a substrate. The first light sensor and the second light sensor are configured to detect incident light. A Ge film is formed over the first light sensor. The Ge film does not cover the second light sensor.

According to some embodiments, a light detector includes a first photodiode and a second photodiode to detect incident light. A Ge film is disposed over the first light sensor to pass infra-red (IR) wavelength light and to block visible wavelength light. The Ge film does not cover the second light sensor. A circuit is configured to receive a first photocurrent from the first light sensor and a second photocurrent from the second light sensor to produce a visible light response based on the first and second photocurrents.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A light detector, comprising:
   a first light sensor;
   a second light sensor;
   a Ge film disposed over the first light sensor to pass infrared (IR) wavelength light and to block visible wavelength light, wherein the Ge film does not cover the second light sensor; and
   a circuit configured to receive a first photocurrent from the first light sensor and a second photocurrent from the second light sensor and further configured to generate a visible light response based on at least a ratio of at least the second photocurrent and at least the first photocurrent.

2. The light detector of claim 1, wherein the first light sensor and the second light sensor are photodiodes.

3. The light detector of claim 1, wherein the Ge film has a thickness ranging from 500 angstrom to 5000 angstrom.

4. The light detector of claim 1, further comprising a green filter layer covering both the first light sensor and the second light sensor.

5. The light detector of claim 4, wherein the green filter layer comprises copper phthalocyanine dye and pyridine azo dye.

6. The light detector of claim 4, wherein the green filter layer has a thickness ranging from 0.5 μm to 1 μm.

7. The light detector of claim 1, wherein the circuit is further configured to generate the visible light response by determining a logarithmic value of a ratio of the second photocurrent divided by the first photocurrent.

8. The light detector of claim 7, wherein the circuit is further configured to multiply the first photocurrent by a first constant and multiply the second photocurrent by a second constant.

9. A method of fabricating a light detector, comprising:
    forming a first light sensor and a second light sensor on a substrate; forming a Ge film over the first light sensor, wherein the Ge film does not cover the second light sensor; and
    forming a circuit configured to receive a first photocurrent from the first light sensor and a second photocurrent from the second light sensor and further configured to generate a visible light response based on at least a ratio of at least the second photocurrent and at least the first photocurrent.

10. The method of claim 9, wherein the first light sensor and the second light sensor are photodiodes.

11. The method of claim 9, wherein the Ge film is formed to a thickness of from 500 angstrom to 5000 angstrom.

12. The method of claim 9, further comprising forming a green filter layer over the first light sensor and the second light sensor.

13. The method of claim 12, wherein the green filter layer comprises copper phthalocyanine dye and pyridine azo dye.

14. The method of claim 12, wherein the green filter layer is formed to a thickness ranging from 0.5 μm to 1 μm.

15. The method of claim 9, further comprising forming a dielectric layer over the first light sensor and the second light sensor.

16. The method of claim 9, further comprising forming a passivation layer over the first light sensor and the second light sensor.

17. A light detector, comprising:
    a first photodiode;
    a second photodiode;
    a Ge film disposed over the first photodiode, wherein the Ge film does not cover the second photodiode; and
    a circuit configured to receive a first photocurrent from the first photodiode and a second photocurrent from the second photodiode and further configured to produce a visible light response based on at least a ratio of the first and second photocurrents.

18. The light detector of claim 17, further comprising a green filter layer covering both the first photodiode and the second photodiode, wherein the green filter layer has a maximum light transmittance at a wavelength ranging from 500 nm to 600 nm.

19. The light detector of claim 18, wherein the green filter layer comprises copper phthalocyanine dye and pyridine azo dye.

* * * * *